(12) United States Patent
McLaughlin et al.

(10) Patent No.: US 12,725,754 B2
(45) Date of Patent: Sep. 1, 2026

(54) CAPTIVE SPRING HOOKS FOR REDUCED ELECTROSTATIC STRESS

(71) Applicant: Applied Materials, Inc., Santa Clara, CA (US)

(72) Inventors: Adam M. McLaughlin, Merrimac, MA (US); Diana C. Gronski, Salisbury, MA (US); Craig R. Chaney, Gloucester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 350 days.

(21) Appl. No.: 18/653,463

(22) Filed: May 2, 2024

(65) Prior Publication Data

US 2025/0343022 A1 Nov. 6, 2025

(51) Int. Cl.
*H01J 37/08* (2006.01)
*H01J 37/317* (2006.01)

(52) U.S. Cl.
CPC .......... *H01J 37/08* (2013.01); *H01J 37/3171* (2013.01)

(58) Field of Classification Search
None
See application file for complete search history.

(56) References Cited

U.S. PATENT DOCUMENTS 9,859,098 B2 1/2018 Holden et al.
10,325,752 B1 6/2019 Calkins et al.
10,347,457 B1 7/2019 Perel, Sr. et al.
2002/0130278 A1 9/2002 Vella
2007/0107841 A1 5/2007 Horsky et al.
2008/0067412 A1 3/2008 Vanderberg et al.
2015/0130353 A1 5/2015 Lin et al.
2015/0179393 A1 6/2015 Colvin et al.
2015/0357152 A1 12/2015 Jones et al.
2017/0178857 A1 6/2017 Holden et al.
2019/0189387 A1 6/2019 Perel et al.
2021/0110995 A1 4/2021 Patel et al.
2022/0122811 A1 4/2022 Mutyala et al.
(Continued)

FOREIGN PATENT DOCUMENTS

CN 111902906 A 11/2020
CN 114864373 A 8/2022
(Continued)

OTHER PUBLICATIONS

Notice of Allowance mailed Jul. 8, 2025 in co-pending U.S. Appl. No. 18/144,367.
(Continued)

*Primary Examiner* — Eliza W Osenbaugh-Stewart
(74) *Attorney, Agent, or Firm* — Nields, Lemack & Frame, LLC

(57) ABSTRACT

A faceplate and fasteners for attaching the faceplate to an ion source are disclosed. The faceplate includes a plurality of channels that open to the side of the faceplate. These channels are an elongated shape such that the channels are larger in one direction than in the orthogonal direction. The channels each terminate in an internal cavity, which has a larger size than the channels. The fasteners may be rods that are shaped such that the proximal ends of the fastener have a bent portion, which can only enter the channel when properly oriented. Once the bent portion is passed through the channel and extends into the internal cavity, the fastener can be rotated so as to secure it in place.

19 Claims, 10 Drawing Sheets

(56) References Cited

U.S. PATENT DOCUMENTS

| | | | |
|---|---|---|---|
| 2023/0245859 | A1 | 8/2023 | Bassom et al. |
| 2023/0411136 | A1 | 12/2023 | Loboda et al. |
| 2024/0371608 | A1 | 11/2024 | Prager et al. |
| 2024/0379319 | A1 | 11/2024 | Walder |

FOREIGN PATENT DOCUMENTS

| | | | |
|---|---|---|---|
| JP | 2001-210245 | A | 8/2001 |
| JP | 2017-228373 | A | 12/2017 |
| KR | 2009-0029212 | A | 3/2009 |
| TW | M374647 | U | 2/2010 |
| TW | 202046364 | A | 12/2020 |
| TW | 202129677 | A | 8/2021 |
| TW | 202347408 | A | 12/2023 |
| WO | 2016/170703 | A1 | 10/2016 |

OTHER PUBLICATIONS

International Search Report and Written Opinion mailed Aug. 7, 2024 in co-pending PCT application No. PCT/US2024/022980.

International Search Report and Written Opinion mailed Jul. 22, 2025 in corresponding PCT application No. PCT/US2025/023697.

International Search Report and Written Opinion mailed Jul. 23, 2024 in co-pending PCT application No. PCT/US2024/022995.

Notice of Allowance mailed Sep. 9, 2025 in co-pending U.S. Appl. No. 18/143,684.

60
58
57
51

60
58
57
51

60
57
51

60
57
51

CAPTIVE SPRING HOOKS FOR REDUCED ELECTROSTATIC STRESS

FIELD

Embodiments of the present disclosure relate to a fastener for securing a faceplate to an ion source.

BACKGROUND

The fabrication of a semiconductor device involves a plurality of discrete and complex processes. One such process may utilize an ion beam, which may be extracted from an ion source. In an ion source, a feed gas is energized to form ions. Those ions are then extracted from the ion source through an extraction aperture disposed on a faceplate. The ions are manipulated downstream by a variety of components, including electrodes, acceleration and deceleration stages, and mass analyzers.

One such ion source is an indirectly heated cathode ion source. An indirectly heated cathode (IHC) ion source operates by supplying a current to a filament disposed behind a cathode. The filament emits thermionic electrons, which are accelerated toward the cathode via an applied electric potential, which in turn heats the cathode causing electrons to be emitted into the arc chamber of the ion source. The cathode is disposed at one end of an arc chamber. A repeller may be disposed on the end of the arc chamber opposite the cathode. The cathode and repeller may be biased so as to repel the electrons, directing them back toward the center of the arc chamber. In some embodiments, a magnetic field is used to further confine the electrons within the arc chamber. A plurality of sides is used to connect the two ends of the arc chamber.

An extraction aperture is disposed along one of these sides, referred to as the faceplate. The extraction aperture is located proximate to the center of the arc chamber, through which the ions created in the arc chamber may be extracted.

Typically, the faceplate is a separate component from the rest of the arc chamber. As such, it is secured to the arc chamber. However, the traditional means of securing the faceplate create regions of high electrostatic stress, which may cause arcing to nearby components, such as the extraction electrode.

Therefore, it would be beneficial if there was a fastener that may be used to secure the faceplate to the arc chamber which reduced the electrostatic stress and risk of arcing.

SUMMARY

A faceplate and fasteners for attaching the faceplate to an ion source are disclosed. The faceplate includes a plurality of channels that open to the side of the faceplate. These channels are an elongated shape such that the channels are larger in one direction than in the orthogonal direction. The channels each terminate in an internal cavity, which has a larger size than the channels. The fasteners may be rods that are shaped such that the proximal ends of the fastener have a bent portion, which can only enter the channel when properly oriented. Once the bent portion is passed through the channel and extends into the internal cavity, the fastener can be rotated so as to secure it in place.

According to one embodiment, an ion source is disclosed. The ion source comprises an arc chamber comprising a plurality of chamber walls and having a first end and a second end; a faceplate having an extraction aperture, disposed on a top of the plurality of chamber walls, the faceplate comprising a plurality of channels open to an exterior of the faceplate, and each channel terminating at a respective internal cavity; a source housing, wherein the arc chamber is disposed on the source housing; a plurality of fasteners, each having a proximal end with a bent portion, wherein the proximal end of each fastener passes through a respective channel and wherein the bent portion is disposed in the respective internal cavity; and a tension system in communication with a distal end of each fastener to attach each fastener to the source housing so as to secure the faceplate to the arc chamber. In some embodiments, each channel of the plurality of channels has a cross-section of an elongated shape having a first direction and a second direction, wherein a dimension of the first direction is less than a dimension of the second direction. In certain embodiments, the first direction is a height direction, which is parallel to a thickness of the faceplate. In certain embodiments, the dimension in the first direction of the internal cavity is larger than the dimension of the channel in the first direction to allow a rotation of a respective fastener. In certain embodiments, the bent portion extends in the first direction within the internal cavity such that the fastener cannot be removed from the internal cavity without rotation of the fastener. In certain embodiments, the fastener is rotated at an angle between 70° and 110° so as to be removed from the internal cavity. In some embodiments, each fastener comprises a second bend disposed at a position where the fastener exits the channel. In some embodiments, a distal end of each fastener comprises a retaining portion, and wherein the tension system is coupled to the retaining portion to secure the faceplate to the arc chamber. In certain embodiments, the tension system comprises a spring in communication with the retaining portion and the source housing. In some embodiments, at least one of the plurality of fasteners comprises a single rod. In some embodiments, at least one of the plurality of fasteners comprises a plurality of segments, wherein one of the plurality of segments includes the bent portion, a different one of the plurality of segments includes the retaining portion, and each of the plurality of segments comprises at least one coupling portion to attach to an adjacent segment. In some embodiments, the faceplate has a top surface, an opposite bottom surface that faces an interior of the arc chamber, and a plurality of sides formed between the top surface and the opposite bottom surface, wherein the plurality of channels each open to a respective one of the plurality of sides of the faceplate and the proximal end of each of the plurality of fasteners enters a respective channel on the side of the faceplate.

According to another embodiment, an ion implantation system is disclosed. The ion implantation system comprises the ion source described above to generate ions; and one or more beamline components to direct the ions toward a workpiece holder.

According to another embodiment, a faceplate for use with an ion source is disclosed. The faceplate comprises a top surface; an opposite bottom surface configured to face an arc chamber of the ion source; an extraction aperture passing from the top surface to the opposite bottom surface; a plurality of sides formed between the top surface and the opposite bottom surface; and a plurality of channels, wherein the plurality of channels each open to a respective one of the plurality of sides, and wherein each channel terminates in a respective internal cavity. In some embodiments, each channel of the plurality of channels has a cross-section of an elongated shape having a first direction and a second direction, wherein a dimension of the first direction is less than a dimension of the second direction. In certain embodiments, the first direction is a height direction, which is parallel to a thickness of the faceplate. In some embodiments, the dimension in the first direction of the internal cavity is larger than the dimension of the channel in the first direction to allow a rotation of a respective fastener.

According to another embodiment, a method of attaching the faceplate described above to an ion source is disclosed. The method comprises inserting a respective fastener into each of the channels, wherein each fastener comprises a distal end having a bent portion; rotating the fastener when the bent portion extends into the interval cavity to secure the fastener to the faceplate; and securing a distal end of the fastener to a source housing on which the ion source is disposed. In some embodiments, the fastener is rotated between 70° and 110° to secure the fastener to the faceplate.

BRIEF DESCRIPTION OF THE FIGURES

For a better understanding of the present disclosure, reference is made to the accompanying drawings, which are incorporated herein by reference and in which.

DETAILED DESCRIPTION

As described above, the means for securing the faceplate to an arc chamber may create an undesirable amount of electrostatic stress, which may increase the risk of arcing.

Figure 1:
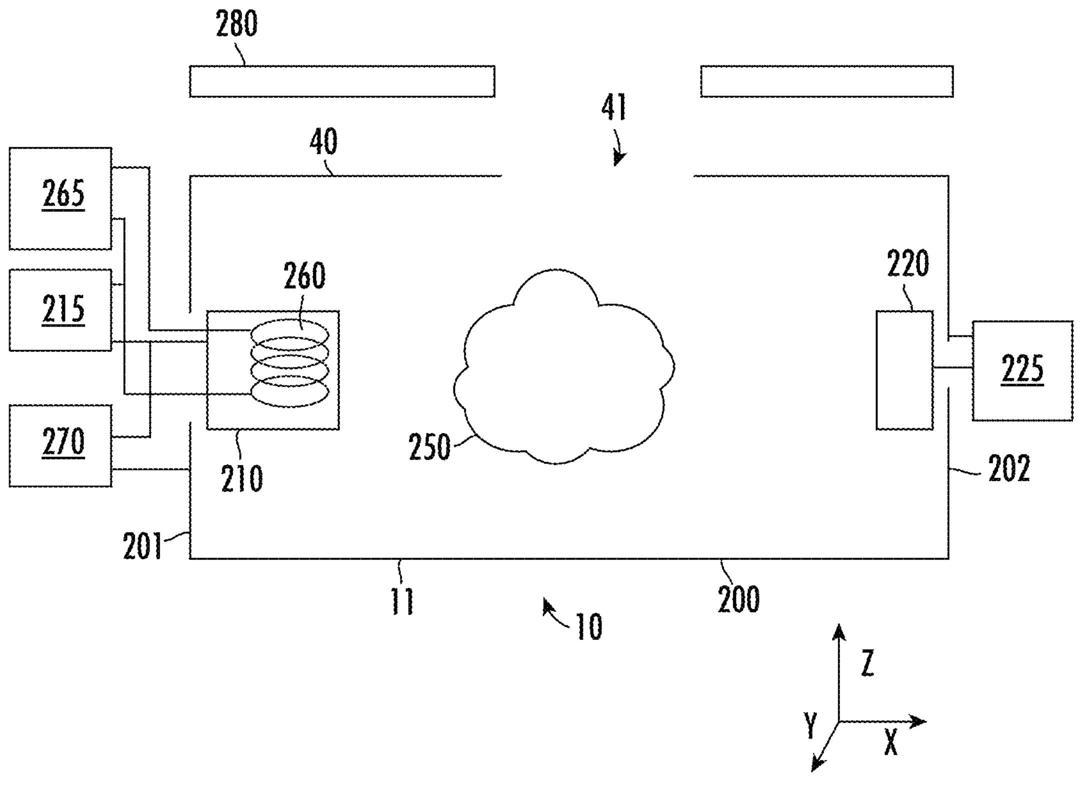
FIG. 1 is a view of the ion source according to one embodiment.

FIG. 1 shows a side view of an ion source 10 with an improved faceplate and fastener for securing the faceplate according to one embodiment. The ion source 10 includes an arc chamber 200, comprising two opposite ends, and chamber walls 11 connecting to these ends. The arc chamber 200 also includes a bottom wall and faceplate 40. The chamber walls 11 may be constructed of an electrically and thermally conductive material and may be in electrical communication with one another. The faceplate 40 having an extraction aperture 41 may be disposed against the chamber walls 11. The faceplate 40 may be a single component, or may be comprised of a plurality of components. For example, in one embodiment, the faceplate 40 includes a faceplate insert that is disposed beneath the outer faceplate and helps define the extraction aperture 41. Thus, the term "faceplate" as used in this disclosure refers to any component or components that make up the structure that includes the extraction aperture 41 through which the ions are removed.

Within the arc chamber 200 may be a mechanism to create ions. For example, in one embodiment, an indirectly heated cathode (IHC) may be disposed within the arc chamber 200. In this embodiment, a cathode 210 is disposed in the arc chamber 200 at a first end 201 of the arc chamber 200. A filament 260 is disposed behind the cathode 210. The filament 260 is in communication with a filament power supply 265. The filament power supply 265 is configured to pass a current through the filament 260, such that the filament 260 emits thermionic electrons. Cathode bias power supply 215 biases filament 260 negatively relative to the cathode 210, so these thermionic electrons are accelerated from the filament 260 toward the cathode 210 and heat the cathode 210 when they strike the back surface of cathode 210. The cathode bias power supply 215 may bias the filament 260 so that it has a voltage that is between, for example, 200V to 1500V more negative than the voltage of the cathode 210. The cathode 210 then emits thermionic electrons on its front surface into arc chamber 200.

Thus, the filament power supply 265 supplies a current to the filament 260. The cathode bias power supply 215 biases the filament 260 so that it is more negative than the cathode 210, so that electrons are attracted toward the cathode 210 from the filament 260. Additionally, the cathode 210 may be electrically biased relative to the arc chamber 200, using cathode power supply 270.

In this embodiment, a repeller 220 is disposed in the arc chamber 200 on the second end 202 of the arc chamber 200 opposite the cathode 210. The repeller 220 may be in communication with repeller power supply 225. As the name suggests, the repeller 220 serves to repel the electrons emitted from the cathode 210 back toward the center of the arc chamber 200. For example, the repeller 220 may be biased at a negative voltage relative to the arc chamber 200 to repel the electrons. For example, the repeller power supply 225 may have an output in the range of 0 to −150V, although other voltages may be used. In certain embodiments, the repeller 220 is biased at between 0 and −150V relative to the arc chamber 200. In other embodiments, the cathode power supply 270 is used to supply a voltage to the repeller 220 as well. In other embodiments, the repeller 220 may be electrically grounded or floating.

In operation, a gas is supplied to the arc chamber 200. The thermionic electrons emitted from the cathode 210 cause the gas to form a plasma 250. Ions from this plasma 250 are then extracted through an extraction aperture 41 in the faceplate 40. The ions are then manipulated to form an ion beam that is directed toward the workpiece. An extraction electrode 280 is disposed outside the arc chamber 200 and proximate the extraction aperture 41. The extraction electrode 280 is biased at a voltage different from the arc chamber 200 so as to attract ions from within the arc chamber 200 through the extraction aperture 41.

It is noted that other mechanisms for generating ions may be used. These other mechanisms include, but are not limited to, Bernas ion source, RF antennas, and capacitively coupled sources.

Figure 2:
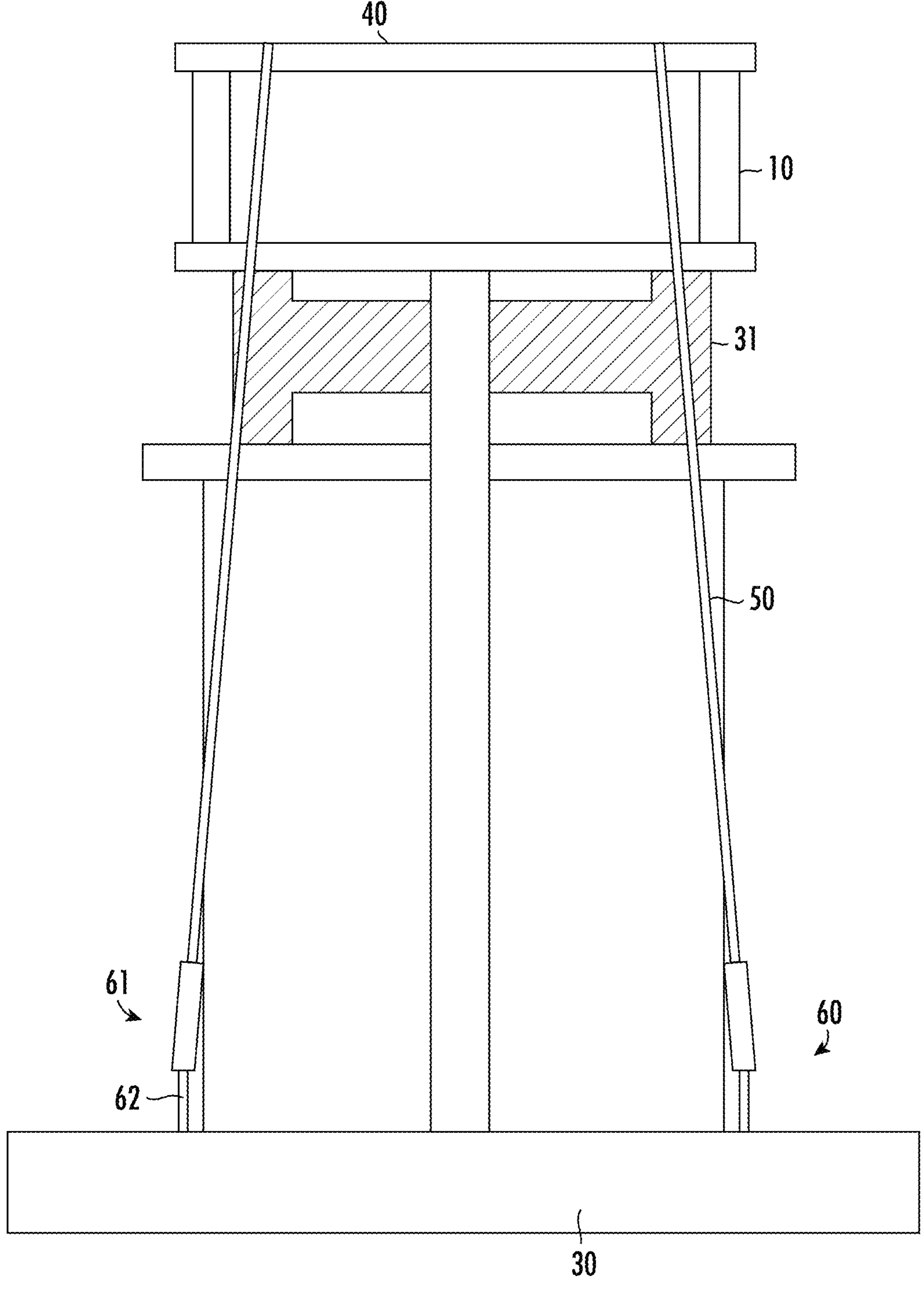
FIG. 2 shows the ion source attached to the source housing using fasteners.

As best seen in FIG. 2, the faceplate 40 is secured to the source housing 30 using a plurality of fasteners 50. The fasteners 50 may be held in place using a tension system 60, which may include a plurality of springs 61, which are each attached to the source housing 30 using brackets 62. The term "tension system" is meant to denote that the fasteners 50 are under tension. This may be achieved in many ways, including tension springs and compression springs. The arc chamber 200 may be disposed on or attached to the source housing 30. In some embodiments, the ion source 10 may be disposed on the source housing 30 but separated from the source housing 30 by a base 31. In certain embodiments, the source housing 30 may be temperature controlled. For example, the source housing 30 may be attached to a heat sink, or may be a heat sink itself.

Figure 3:
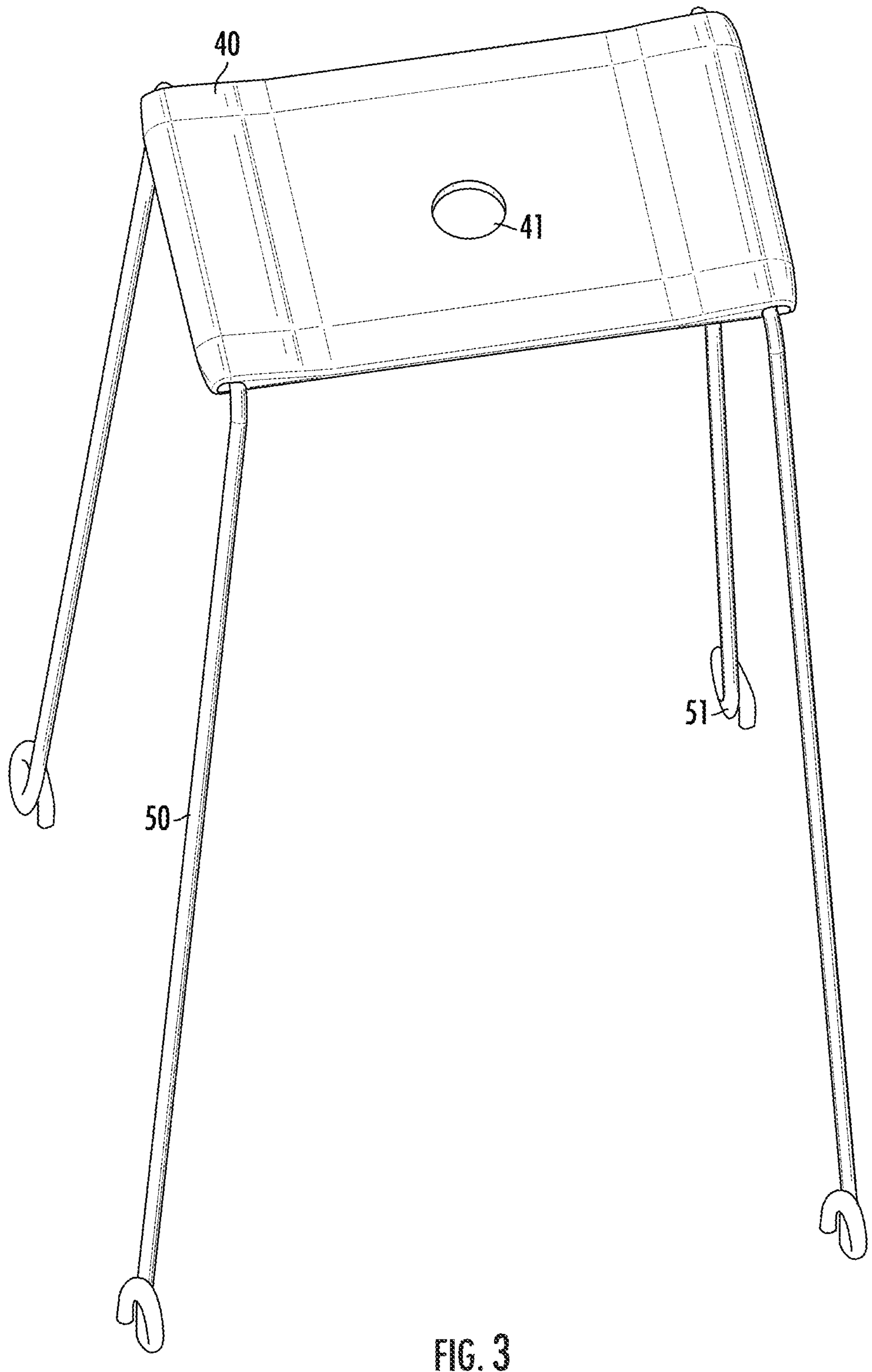
FIG. 3 is an isolated view of the faceplate and the fasteners.

FIG. 3 shows the faceplate 40 and the associated fasteners 50. Note that while FIG. 3 shows the extraction aperture 41 as circularly shaped, the extraction aperture 41 may be other shapes as well, such as an elongated slot. The fasteners 50 may be attached to the faceplate 40 at a plurality of points. In some embodiments, the fasteners 50 may be attached near each of the four corners of the faceplate 40. The fasteners 50 may be one or more rods having a circular cross-section. These rods may be shaped to create the features described below. The distal ends of the fasteners 50 may include a retaining portion 51 that is used to secure the fastener 50 to the source housing 30 using springs 61, as described above. In some embodiments, the retaining portion 51 may be shaped as a loop or as a hook. For example, a closed end of the spring 61 may be inserted into the retaining portion 51.

Figure 4:
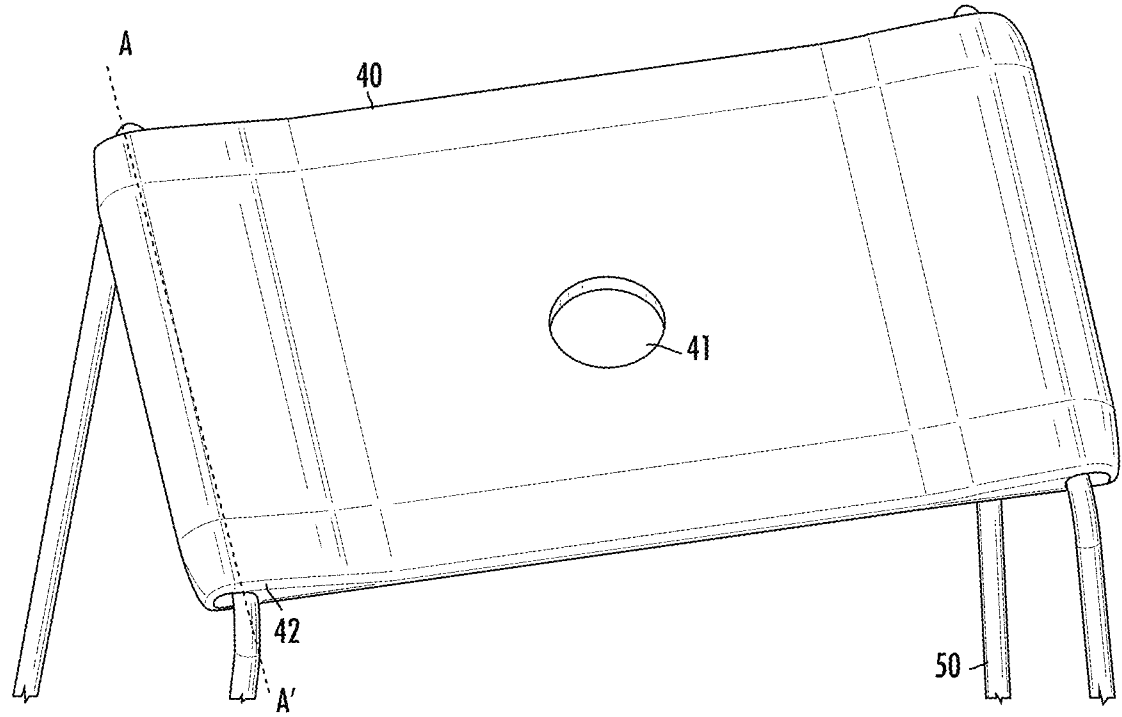
FIG. 4 is an enlarged view of the faceplate of FIG. 3.

FIG. 4 shows the faceplate 40 in more detail. The faceplate 40 has a top surface, an opposite bottom surface that faces the interior of the arc chamber 200, and sides connecting the top surface and the opposite bottom surface. Note that the proximal ends of the fasteners are each disposed in a respective channel 42, with an opening in a respective side of the faceplate 40. As will be described in more detail, the fasteners 50 are inserted into the channels 42 in an installation position and are then rotated to an operational position. Each channel 42 is completely contained within the material that forms the faceplate 40, such that each channel 42 is only open to the exterior along the side of the faceplate 40.

Figure 5:
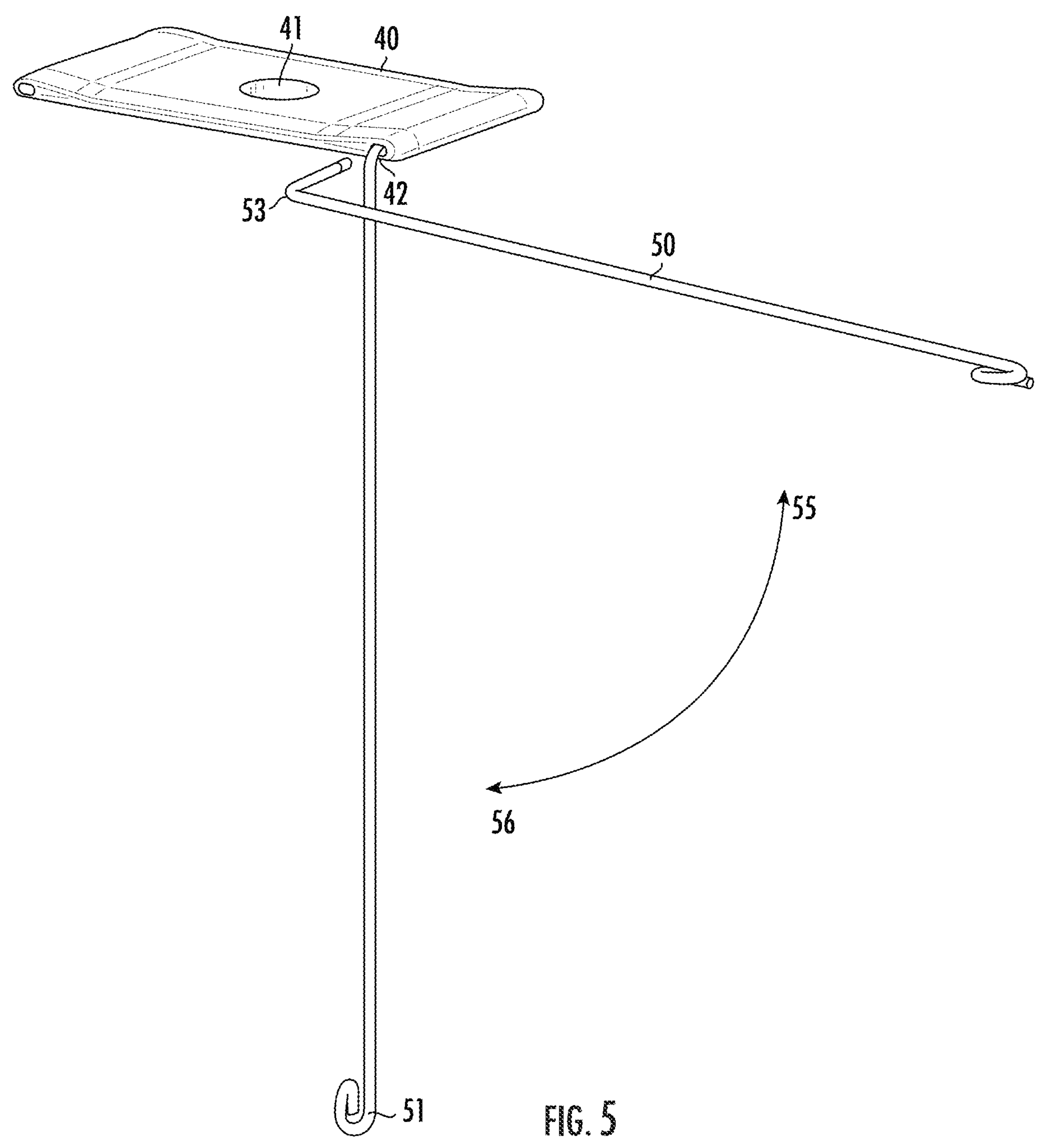
FIG. 5 shows the installation and operational positions.

FIG. 5 shows the two positions of the fastener 50. Fastener 50 may be inserted into the channel 42 of the faceplate 40 when in the installation position 55. As described below, once the fastener 50 is inserted to a depth wherein the bent portion 52 (see FIG. 6) extends into the internal cavity 43, the fastener 50 may be rotated to operational position 56. Additionally, the fastener 50 has a second bend 53 located near the proximal end, where the fastener 50 emerges from the channel 42. This second bend 53 is contoured so as to create a smooth curve from the top surface of the faceplate 40 to the fastener 50. In some embodiments, the second bend 53 may be about 90°. In other embodiments, the second bend 53 may be between about 80° and 100°.

Figure 6:
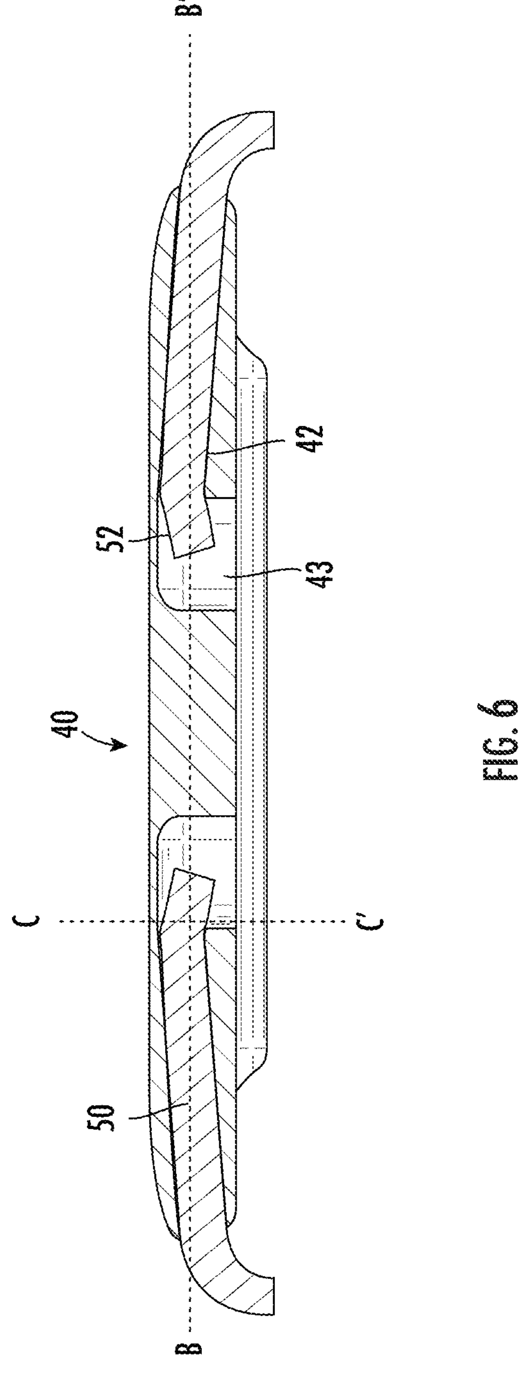
FIG. 6 shows a cross section of the faceplate along line A-A' according to one embodiment.

FIG. 6 shows a cross-sectional view of the faceplate 40 and fasteners 50 taken along line A-A' of FIG. 4. In this figure, the fasteners 50 are in the operational position 56. Note that the proximal end of the fastener 50 includes a bent portion 52. The bend angle is implementation dependent and may be 15° or more in some embodiment. Further, the bent portion 52 may have a length of 0.1 inches or more. The fastener 50 is inserted into a channel 42 in the faceplate 40. The channel 42 may have the cross-section of an elongated shape, such as an elongated circle or a rectangle, such that the dimension in a first direction 45 (see FIG. 8A) may be slightly larger than the diameter of the fastener 50 and is also smaller than that needed to pass the bent portion 52 through the channel 42. In other words, to pass the fastener 50 through the channel 42, the fastener 50 is rotated 90° to be in the installation position 55, such that the bent portion 52 bends in the plane that is orthogonal to the first direction 45. The dimension of the second direction 46 (see FIG. 8A), which may be perpendicular to the first direction 45, may be larger than that of the first direction 45, as described in more detail below. In FIG. 6, this first direction 45 is the height direction, which is the direction that is parallel to the thickness of the faceplate 40. The channel 42 may have a depth of 0.5 inches or more and terminate in an internal cavity 43. The internal cavity 43 has a dimension in the first direction 45 that is greater than the dimension of the channel 42 in the first direction 45 and is large enough such that the bent portion 52 fits within the internal cavity 43 when in the operational position 56. The dimension in the second direction 46 may be the same as that of the channel 42. In certain embodiments, to create the channels 42 and internal cavities 43 described herein, the faceplate 40 may be manufactured using an additive manufacturing process.

Figure 7B:
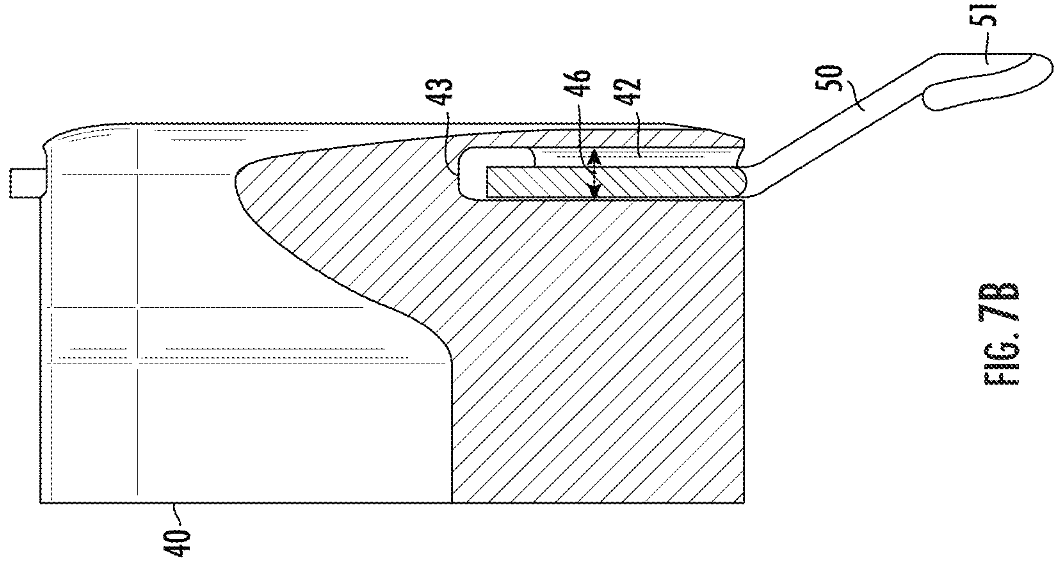
FIGS. 7A-7B show a cross-section of the faceplate along line B-B' in the installation and operational positions, respectively.
Figure 7A:
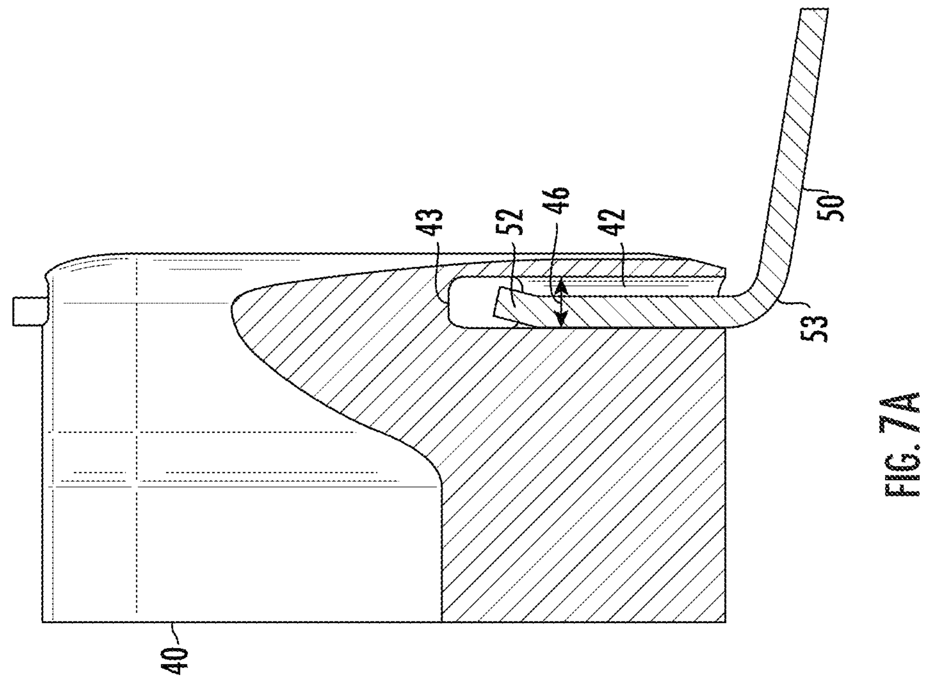

FIGS. 7A-7B show a top view of the cross-section of the faceplate 40 and fastener 50 taken along line B-B' in FIG. 6. FIG. 7A shows the fastener 50 in the installation position 55, while FIG. 7B shows the fastener 50 in the operational position 56.

Figure 8A:
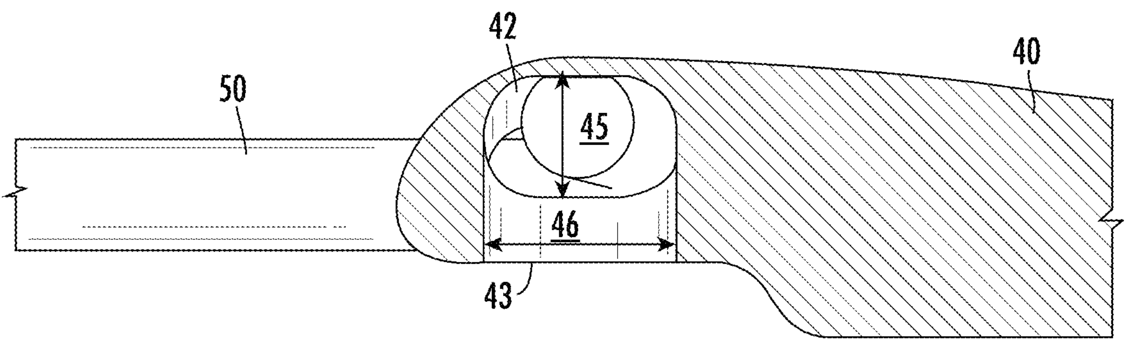
FIGS. 8A-8B show a cross-section of the faceplate along line C-C' in the installation and operational positions, respectively.

Note that the channel 42 has a second direction 46, which may be perpendicular to the first direction 45 (see FIG. 8A). The dimension of the channel 42 in the second direction 46 is larger than the dimension in the first direction 45. Additionally, the dimension in the second direction 46 is large enough so that the bent portion 52 of the fastener 50 is able to be passed through the channel 42 when oriented in the installation position 55 shown in FIG. 7A. As shown in FIG. 7A, when fully inserted, the bent portion 52 extends into the internal cavity 43 such that the fastener 50 may then be rotated to the operational position 56, as shown in FIG. 7B.

Figure 8B:
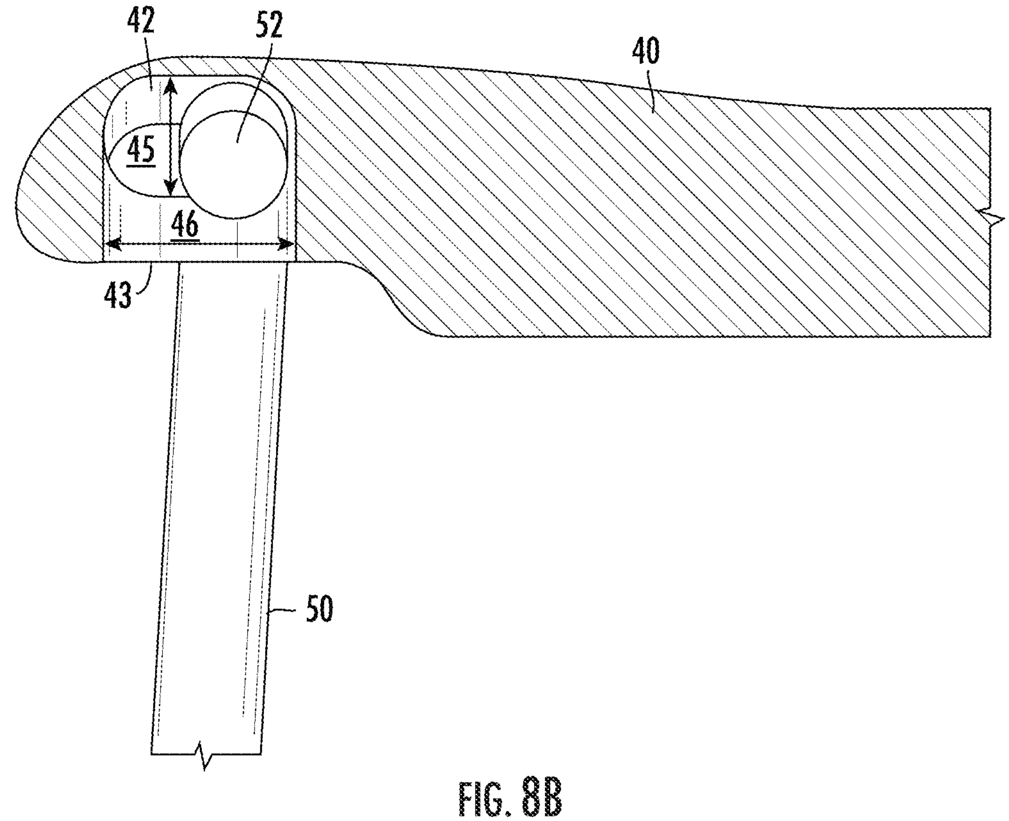

FIG. 8A-8B show a cross-sectional view of the faceplate 40 and fastener 50 taken along line C-C' in FIG. 6. FIG. 8A shows the fastener 50 in the installation position 55, while FIG. 8B shows the fastener 50 in the operational position 56. As can be seen in FIG. 8A, the fastener 50 is installed with the bent portion 52 extending in the second direction 46. Once the bent portion 52 is within the internal cavity 43, the fastener 50 may be rotated to the operational position 56, as shown in FIG. 8B. Note that while in the operational position 56, the bent portion 52 inhibits the movement of the fastener 50 through the channel 42.

Note that while the figures assume that the bent portion 52 is extended downward when in the operational position, other embodiments are possible. For example, the bent portion 52 may be created such that the bent position extends in the horizontal direction when in the operational position. In this embodiment, the second direction of the channel 42 would be in the height direction, while the first direction would be perpendicular to the second direction.

Further, while the above disclosure described the installation position 55 and the operational position 56 as being separated by 90°, other embodiments are also possible. For example, these two positions may be separated by an angle between 70° and 110°.

Figures 9A, 9B, 9C, 9D:
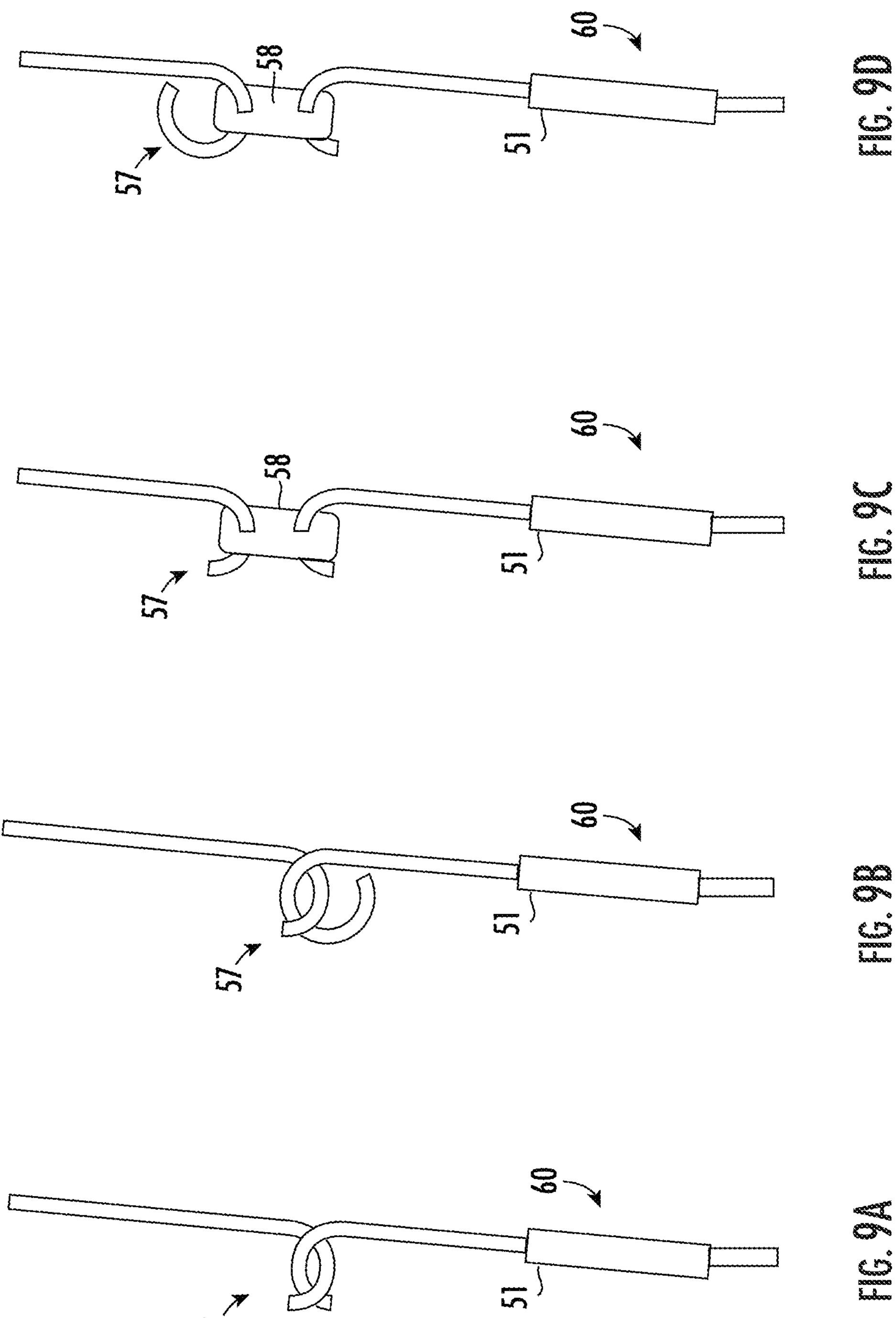
FIGS. 9A-9D show the fastener according to other embodiments.

While FIGS. 2-5 show each fastener 50 as a single rod having a bent portion 52 at the proximal end and a retaining portion 51 at the distal end, other embodiments are also possible. For example, each fastener 50 may comprise multiple segments that may be coupled together. FIGS. 9A-9D show several such embodiments. In each embodiment, there are one or more intermediate coupling portions 57, which are used to attach two segments together. Further, in each embodiment, the proximal end of the fastener 50 includes the bent portion 52 and the second bend 53, and the distal end includes a retaining portion 51. The intermediate coupling portions 57 may be hooks, as shown in FIG. 9A. Alternatively, the intermediate coupling portions 57 may include loops, as shown in FIG. 9B. In FIGS. 9A-9B, the intermediate coupling portions 57 of two segments couple directly to each other. However, in other embodiments, a coupler 58 may be used. In FIGS. 9C-9D, the intermediate coupling portion 57 of the two adjacent segments each attach to a coupler 58. As described above, the intermediate coupling portions 57 may be hooks (see FIG. 9C) or loops (see FIG. 9D). Further, while FIGS. 9A-9D show two segments, it is understood that the fastener 50 may have any number of segments.

Figure 10:
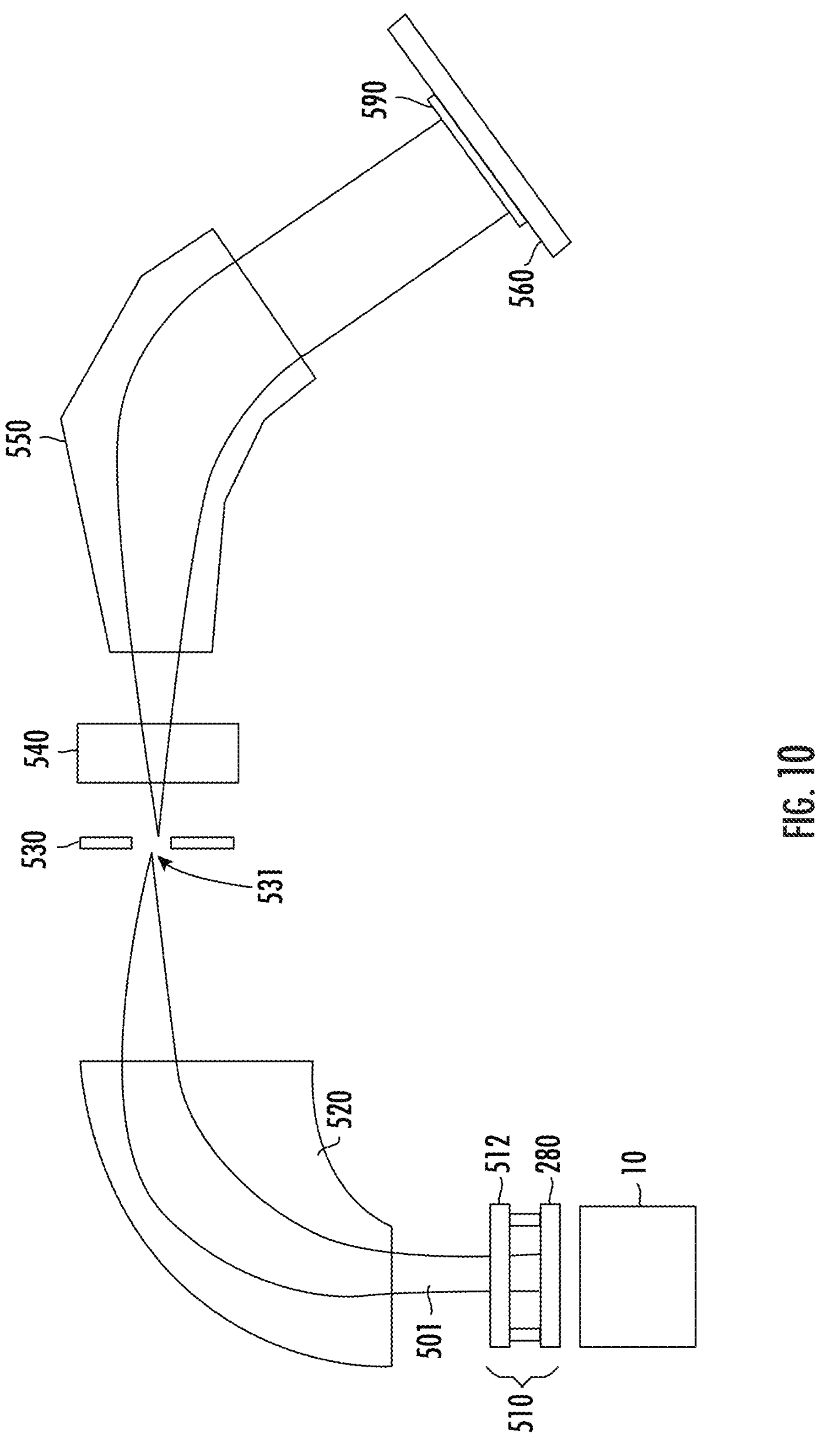
FIG. 10 shows an ion implantation system that employs the ion source and fasteners described herein.

The ion source 10 and fasteners 50 described herein may be used in an ion implantation system, such as that shown in FIG. 10. Disposed outside and proximate the extraction aperture 41 of the ion source 10 are extraction optics 510. In certain embodiments, the extraction optics 510 comprise one or more electrodes, including extraction electrode 280. In certain embodiments, the extraction optics 510 may comprise a second electrode 512 which may be biased at a different voltage than extraction electrode 280. In some embodiments, in excess of two electrodes, such as three electrodes or four electrodes may be employed. In these embodiments, the electrodes may be functionally and structurally similar to those described above, but may be biased at different voltages.

Located downstream from the extraction optics 510 is a mass analyzer 520. The mass analyzer 520 uses magnetic fields to guide the path of the extracted ions 501. The magnetic fields affect the flight path of ions according to their mass and charge. A mass resolving device 530 that has a resolving aperture 531 is disposed at the output, or distal end, of the mass analyzer 520. By proper selection of the magnetic fields, only those extracted ions 501 that have a selected mass and charge will be directed through the resolving aperture 531. Other ions will strike the mass resolving device 530 or a wall of the mass analyzer 520 and will not travel any further in the system.

One or more beamline components may be disposed downstream from the mass resolving device 530. For example, a collimator 540 may be disposed downstream from the mass resolving device 530. The collimator 540 accepts the extracted ions 501 that pass through the resolving aperture 531 and creates a ribbon ion beam formed of a plurality of parallel or nearly parallel beamlets. In other embodiments, the ion beam may be a spot beam. In this embodiment, an electrostatic scanner may be disposed downstream from the mass resolving device 530 and may be used to move the spot beam in a first direction, as defined below.

Located downstream from the collimator 540 may be an acceleration/deceleration stage 550. The acceleration/deceleration stage 550 may be an electrostatic filter. The electrostatic filter is a beam-line lens component configured to independently control deflection, deceleration, and focus of the ion beam. The output from the acceleration/deceleration stage 550 may be a ribbon ion beam having a width in the first direction, which is much greater than its height in the second direction. Located downstream from the acceleration/deceleration stage 550 is the workpiece holder 560.

The workpiece 590, which may be, for example, a silicon wafer, a silicon carbide wafer, or a gallium nitride wafer, is disposed on the workpiece holder 560. The workpiece holder 560 may be moved in the second direction, which is perpendicular to the first direction, to allow the entirety of the workpiece 590 to be processed by the ion beam.

The embodiments described above in the present application may have many advantages. In one simulation, the fasteners 50 described herein are compared to traditional hooks that are used to hold the faceplate. The hooks are secured into pockets located on the outer surface of the faceplate. Because of their configuration, these hooks may have a bend of more than 90° and a radius of curvature that may be less than 0.2 inches. A simulation of electrostatic stress was performed for both designs. The simulation assumed that an extraction electrode was disposed 1 inch from the faceplate 40 and was biased at a voltage that was 30 kV less than that of the faceplate 40. Because the hooks have a small radius of curvature near the faceplate, a localized region of high electrostatic stress is created. In contrast, the design of the fastener 50, and specifically the second bend 53, increases the radius of curvature. It was found that the maximum electrostatic stress was about 10% less for the fasteners 50 described herein. This reduction in electrostatic stress may result in a reduction in the risk of arcing between the fasteners and the extraction electrode, resulting in higher throughput and higher system availability.

Further, the embodiments described herein offer additional benefits. By creating the disclosed channels and internal cavities, the installation of the fasteners 50 into the faceplate 40 is simplified and made more reliable.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source, comprising:

an arc chamber comprising a plurality of chamber walls and having a first end and a second end;

a faceplate having an extraction aperture, disposed on a top of the plurality of chamber walls, the faceplate comprising a plurality of channels open to an exterior of the faceplate, and each channel terminating at a respective internal cavity;

a source housing, wherein the arc chamber is disposed on the source housing;

a plurality of fasteners, each having a proximal end with a bent portion, wherein the proximal end of each fastener passes through a respective channel and wherein the bent portion is disposed in the respective internal cavity; and a tension system in communication with a distal end of each fastener to attach each fastener to the source housing so as to secure the faceplate to the arc chamber.

2. The ion source of claim 1, wherein each channel of the plurality of channels has a cross-section of an elongated shape having a first direction and a second direction, wherein a dimension of the first direction is less than a dimension of the second direction.

3. The ion source of claim 2, wherein the first direction is a height direction, which is parallel to a thickness of the faceplate.

4. The ion source of claim 2, wherein the dimension in the first direction of the internal cavity is larger than the dimension of the channel in the first direction to allow a rotation of a respective fastener.

5. The ion source of claim 4, wherein the bent portion extends in the first direction within the internal cavity such that the fastener cannot be removed from the internal cavity without rotation of the fastener.

6. The ion source of claim 5, wherein the fastener is rotated at an angle between 70° and 110° so as to be removed from the internal cavity.

7. The ion source of claim 1, wherein each fastener comprises a second bend disposed at a position where the fastener exits the channel.

8. The ion source of claim 1, wherein a distal end of each fastener comprises a retaining portion, and wherein the tension system is coupled to the retaining portion to secure the faceplate to the arc chamber.

9. The ion source of claim 8, wherein the tension system comprises a spring in communication with the retaining portion and the source housing.

10. The ion source of claim 8, wherein at least one of the plurality of fasteners comprises a single rod.

11. The ion source of claim 8, wherein at least one of the plurality of fasteners comprises a plurality of segments, wherein one of the plurality of segments includes the bent portion, a different one of the plurality of segments includes the retaining portion, and each of the plurality of segments comprises at least one coupling portion to attach to an adjacent segment.

12. The ion source of claim 1, wherein the faceplate has a top surface, an opposite bottom surface that faces an interior of the arc chamber, and a plurality of sides formed between the top surface and the opposite bottom surface, wherein the plurality of channels each open to a respective one of the plurality of sides of the faceplate and the proximal end of each of the plurality of fasteners enters a respective channel on the side of the faceplate.

13. An ion implantation system comprising,
- the ion source of claim 1 to generate ions; and
- one or more beamline components to direct the ions toward a workpiece holder.

14. A faceplate for use with an ion source, the faceplate comprising:
- a top surface;
- an opposite bottom surface configured to face an arc chamber of the ion source;
- an extraction aperture passing from the top surface to the opposite bottom surface;
- a plurality of sides formed between the top surface and the opposite bottom surface; and
- a plurality of channels, wherein the plurality of channels each open to a respective one of the plurality of sides, and wherein each channel terminates in a respective internal cavity.

15. The faceplate of claim 14, wherein each channel of the plurality of channels has a cross-section of an elongated shape having a first direction and a second direction, wherein a dimension of the first direction is less than a dimension of the second direction.

16. The faceplate of claim 15, wherein the first direction is a height direction, which is parallel to a thickness of the faceplate.

17. The faceplate of claim 15, wherein the dimension in the first direction of the internal cavity is larger than the dimension of the channel in the first direction to allow a rotation of a respective fastener.

18. A method of attaching the faceplate of claim 15 to an ion source comprising:
- inserting a respective fastener into each of the channels, wherein each fastener comprises a distal end having a bent portion;
- rotating the fastener when the bent portion extends into the interval cavity to secure the fastener to the faceplate; and
- securing a distal end of the fastener to a source housing on which the ion source is disposed.

19. The method of claim 18, wherein the fastener is rotated between 70° and 110° to secure the fastener to the faceplate.

* * * * *